(12) United States Patent
Liu et al.

(10) Patent No.: US 12,483,248 B1
(45) Date of Patent: Nov. 25, 2025

(54) LFPS PULSE DETECTION USING UNIT INTERVAL ADJUSTMENT BASED ON AVERAGE PULSE WIDTH

(71) Applicant: Cadence Design Systems, Inc., San Jose, CA (US)

(72) Inventors: Xiaoyang Liu, San Jose, CA (US); Ning Mi, San Jose, CA (US); Claire Liyan Ying, Los Altos Hills, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 149 days.

(21) Appl. No.: 18/596,366

(22) Filed: Mar. 5, 2024

(51) Int. Cl.
*H03K 21/40* (2006.01)
*H03K 7/08* (2006.01)
*H03K 21/38* (2006.01)

(52) U.S. Cl.
CPC .............. *H03K 21/40* (2013.01); *H03K 7/08* (2013.01); *H03K 21/38* (2013.01)

(58) Field of Classification Search
CPC ...... H03K 21/38; H03K 21/40; H03K 21/403; H03K 3/017; H03K 7/08; G06F 11/16; G06F 11/1608; G06F 30/33
See application file for complete search history.

(56) References Cited

U.S. PATENT DOCUMENTS

2009/0144684 A1\* 6/2009 Seawright ........... G06F 30/3323
716/113

\* cited by examiner

*Primary Examiner* — Long Nguyen
(74) *Attorney, Agent, or Firm* — Schwegman Lundberg & Woessner, P.A.

(57) ABSTRACT

Various embodiments provide for verifying operation of a circuit design with respect to a data communication specification, such as a DisplayPort specification, with Low-Frequency Periodic Signaling (LFPS) pulse detection using unit interval adjustment based on an average pulse width of detected LFPS pulses.

20 Claims, 7 Drawing Sheets

LFPS PULSE DETECTION USING UNIT INTERVAL ADJUSTMENT BASED ON AVERAGE PULSE WIDTH

TECHNICAL FIELD

Embodiments described herein relate to circuit design and, more particularly, to systems, methods, devices, and instructions for detecting Low-Frequency Periodic Signaling (LFPS) pulses using unit interval (UI) adjustment based on an average pulse width of detected LFPS pulses, which can be used to verify operation of a circuit design with respect to a data communication specification that uses LFPS, such as a DisplayPort specification.

BACKGROUND

In the realm of data communication interfaces, Low-Frequency Periodic Signaling (LFPS) is often used to facilitate power management and data transmission. Generally, LFPS comprises physical (PHY) layer signaling that a transmitting device (e.g., a source device) can transmit (e.g., over a main link) to a receiving device (e.g., sink device), where LFPS can enable devices (e.g., a sink device) to enter and exit power-saving states. In particular, by transmitting low-frequency signals, LFPS allows devices (e.g., source devices) to communicate their power state status, thereby orchestrating and synchronizing power states and ensuring that transitions into and out of power states are seamless (e.g., do not disrupt the integrity of data or the stability of the connection). The use of LFPS extends across various data communication interface technologies, including but not limited to Universal Serial Bus (USB) interface technology and DisplayPort interface technology. LFPS is particularly useful with devices where power efficiency is paramount, such as laptops, tablets, and other battery-operated electronics.

BRIEF DESCRIPTION OF THE DRAWINGS

The appended drawings merely illustrate various embodiments of the present disclosure and should not be considered as limiting its scope.

DETAILED DESCRIPTION

Figure 1:
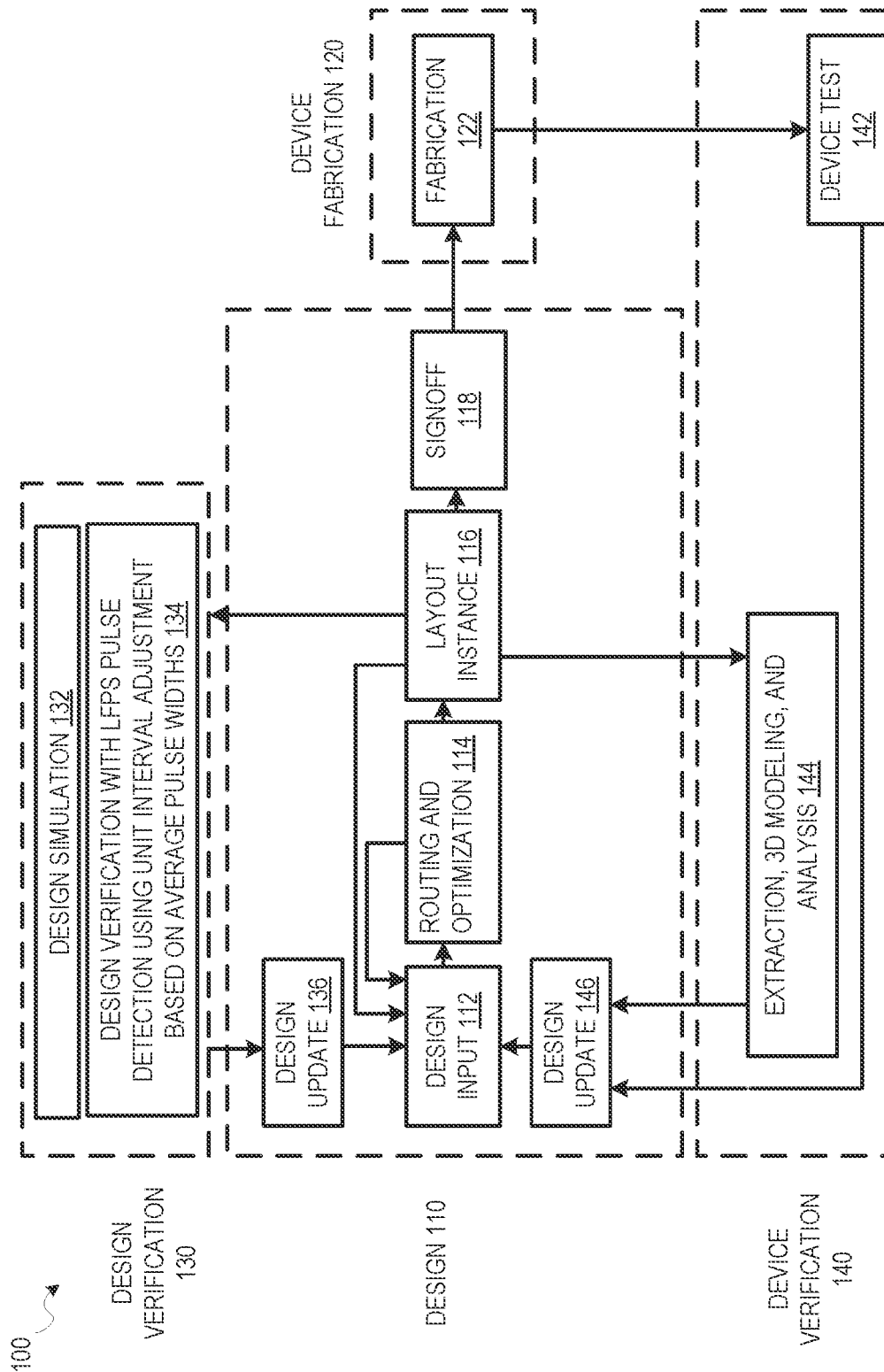
FIG. 1 is a diagram illustrating an example design process flow for design verification with Low-Frequency Periodic Signaling (LFPS) pulse detection using unit interval (UI) adjustment based on an average pulse width of detected LFPS pulses, according to some embodiments.

Generally, as part of ensuring a circuit design will operate as intended/expected (e.g., in accordance with a predefined design or specification), a (design) verification process can be performed on one or more portions of the circuit design to ensure that those portions, and any circuit design intellectual property components (or IP blocks) included therein, function as expected/intended (e.g., meet certain predefined specifications). As used herein, a circuit design (e.g., implementing an electronic device) being verified can be referred to as a device under test (DUT) or a design under verification (DUV). DUT and DUV may be used interchangeably throughout this description. Usually, the circuit design being verified is a non-manufactured/non-physical instance of the circuit design as described by circuit design data (e.g., generated using an electronic design automation (EDA) system). In contrast, a physical circuit design or physical device is tested during a manufacturing test. In the context of verifying an IP block (e.g., DisplayPort IP block) of circuit design that implements one or more features of a design specification, such as a data communication interface specification, the circuit design can represent a System-on-a-chip (SOC), a component, a device, and the like. For example, with respect to a digital display interface specification for DisplayPort technology, the circuit design can represent a System-on-a-chip (SOC) that includes a DisplayPort interface, a DisplayPort component, or a DisplayPort device (e.g., device that includes a DisplayPort interface).

To facilitate (design) verification of a circuit design (e.g., DUT/DUV) implementing a data communication specification, such as a version of the DisplayPort specification or another data communication interface specification, a user typically uses a verification software system configured to simulate data traffic over a data bus (e.g., simulated data bus, such as a simulated DisplayPort bus) coupled to the circuit design and configured to perform one or more specification checks (e.g., protocol checks) on the circuit design. For instance, a (design) verification software system, such as a verification intellectual property (VIP) software system, can verify one or more IP blocks (e.g., DisplayPort IP blocks) of a circuit design with respect to a version of the DisplayPort specification. Typically, a VIP software system comprises a pre-packaged set of code (which can be referred to as VIP) used for verification of an IP block with respect to pre-defined specification. The VIP can, for instance, include a set of assertions on a data bus (e.g., simulated DisplayPort bus) that can be used to verify an IP block with respect to a version of the DisplayPort specification. The verification software system can be part of a testbench, which can comprise a virtual verification environment that includes one or more simulators used in verifying operation of a circuit design (e.g., prior to closure of the circuit design). A verification software system (e.g., VIP software system) for a data communication interface specification (e.g., DisplayPort) can comprise a bus functional model (BFM), which can include one or more data protocol checks for one or more protocol layers defined by the data communication interface specification. Interactions with the DUT/DUV can be generated by an active verification device (e.g., simulated device) of a verification software system in accordance with a model (e.g., BFM or VIP model), where the active verification device can send (e.g., transmit over a simulated data bus) one or more stimuli to the DUT/DUV (e.g., over a simulated data bus) and can receive one or more responses sent (e.g., transmitted over the simulated data bus) by the DUT/DUV, where the one or more responses are sent in sent in response to the one or more stimuli.

With respect to certain data communication interfaces, such as DisplayPort interfaces, there exists a challenge in verifying a DUT (e.g., circuit design that includes a DisplayPort IP block) and managing the DUT's transition between various power states. As noted, DisplayPort and other data communication interfaces can use Low-Frequency Periodic Signaling (LFPS) as a mechanism to signal power state transitions, such as entering or exiting a low-power state. Usually, LFPS comprises a LFPS setup, followed by a LFPS period, followed by silence, and then followed by a PHY establish period (e.g., comprising transmission of PHY lock signals). Additionally, a LFPS cycle period (also referred to herein as tLFPS_Cycle) can comprise a width of the LFPS pulses during the LFPS period, where pulse-to-pulse variation is allowed within the range of the LFPS cycle period.

Traditionally, a design verification system detects LFPS by initially setting (e.g., preprogramming) an initial value of a LFPS cycle period (tLFPS_Cycle) (also referred to herein as a LFPS unit interval (UI)) based on pulse width of a single initial (e.g., first) LFPS pulse detected, by detecting at least one subsequent LFPS pulse based on the LFPS cycle period (e.g., within the LFPS cycle period or LFPS UI), and adjusting the LFPS cycle period (or LFPS UI) based on pulse-to-pulse variation determined (e.g., detected) by the design verification system. Unfortunately, there are technical difficulties with this approach of detecting and verifying LFPS when verifying operation of a DUT. In particular, challenges arise when the pulse-to-pulse variations in the LFPS cycle period are out of the expected range. Such variations can lead to complications in a design verification system (e.g., by a passive verification device thereof that is operating as a VIP monitor) detecting LFPS pulses, which can result in the design verification system (e.g., VIP monitor thereof) either hanging or moving unexpectedly forward, which can result in unrelated verification error messages (e.g., verification log comprises an error message indicating "unexpected LFPS cycle" with a time of detection) being issued and can complicate the circuit design debugging process during design verification.

Various embodiments described herein cure these and other deficiencies of conventional verification methodologies, especially with respect to verifying implementation of a data communication specification by a circuit design, where the data communication specification uses LFPS, such as a DisplayPort specification or another data communication interface specification. In particular, various embodiments provide methodologies for detecting LFPS pulses using unit interval (UI) adjustment (e.g., dynamic UI adjustment) based on an average pulse width of detected LFPS pulses, where such methodologies can be used to verify operation of a circuit design with respect to a data communication specification that uses LFPS, such as a DisplayPort specification. The unit interval for the LFPS can be referred to herein as LFPS unit interval (UI), and a unit interval can comprise a value measured in time (e.g., nanoseconds or the like). Various embodiments described herein provide for reliably detecting LFPS, accurately reporting any out-of-range LFPS cycle periods, and handling these variations without causing unnecessary verification errors or system instability. Various embodiments achieve this by averaging pulse widths of a series of LFPS pulses detected and using the average pulse width as a baseline for continuous LFPS detection, and for subsequent adjustment. For some embodiments, LFPS pulses are detected based on a LFPS UI. A LFPS UI can determine or define an expected LFPS cycle in which to detect for LFPS pulses. Additionally, for some embodiments, a pulse width of a detected LFPS pulse is calculated based on the time difference between detected events (e.g., LFPS events). Some embodiments determine when a certain number of consecutive LFPS pulses (forming a series of LFPS pulses) exceed a current value of the LFPS UI (e.g., by a current threshold), an adjustment of the current value of the LFPS UI is triggered. According to some embodiments, the current value of the LFPS UI is updated (e.g., adjusted) based on an average pulse width of LFPS pulses in the series of LFPS pulses. The updated (e.g., adjusted) LFPS UI can then be used to process (e.g., detect for) subsequent LFPS signals.

The approach by various embodiments described herein contrasts with traditional methods for LFPS detection that rely on a preprogrammed LFPS cycle period (e.g., preprogrammed tLFPS_Cycle), which can lead to errors and design verification system hang-ups when faced with out-of-spec pulse width variations. Unlike traditional methodologies, various embodiments described herein can facilitate detection of any LFPS pulse during design verification system of a DUT with respect to a design specification (e.g., a DisplayPort specification), whether the LFPS pulse is within or outside the range of the expected LFPS cycle. Various embodiments described herein can also provide, during design verification of a DUT, clear error reporting for LFPS pulses that are out of range, thereby simplifying the debugging process and reducing the time required to resolve issues during design verification.

Though various embodiments are described herein with respect to verifying a circuit design with respect to a version of the DisplayPort specification, some embodiments can be applied to one or more other data communication specifications (e.g., protocols or standards) that make use of LFPS.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for design verification with LFPS pulse detection using UI adjustment based on an average pulse width of detected LFPS pulses, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floor planning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial Circuit layout, and any of the routing and optimization 114 operations are performed, a resulting layout is generated as the layout instance 116. The netlist, as placed by the layout instance 116, describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance. A design update 136 based on the design verification phase 130, a design update 146 from the device test 142 operations or the extraction, 3D modeling, and analysis 144 operations, or the design input 112 operation may occur after the initial layout instance 116 is generated. In various embodiments, whenever design inputs are used to update or change an aspect of a circuit design, a timing analysis and the routing and optimization 114 operations may be performed.

As shown, the design verification phase 130 includes a design verification with LFPS pulse detection using unit interval adjustment based on average pulse width 134 operation, which can be configured to verify one or more operations of a circuit design with respect to a data communication specification, such as a version of the DisplayPort specification, with LFPS pulse detection using UI adjustment based on average pulse width of detected LFPS pulses, in accordance with various embodiment described herein. Depending on the embodiment, the design verification with LFPS pulse detection using unit interval adjustment based on average pulse width 134 operation can be performed as part of a verification software system and, more specifically, as part of a verification monitor task or process (also referred to herein as a verification monitor) of the verification software system. For example, with respect to a version of the DisplayPort specification, the design verification with LFPS pulse detection using unit interval adjustment based on average pulse width 134 operation can cause a verification monitor (e.g., VIP monitor) to detect for LFPS pulses based on a current value of a LFPS UI, and to update the current value of the LFPS UI based on an average pulse widths of a series of previously-detected LFPS pulses.

Figure 2:
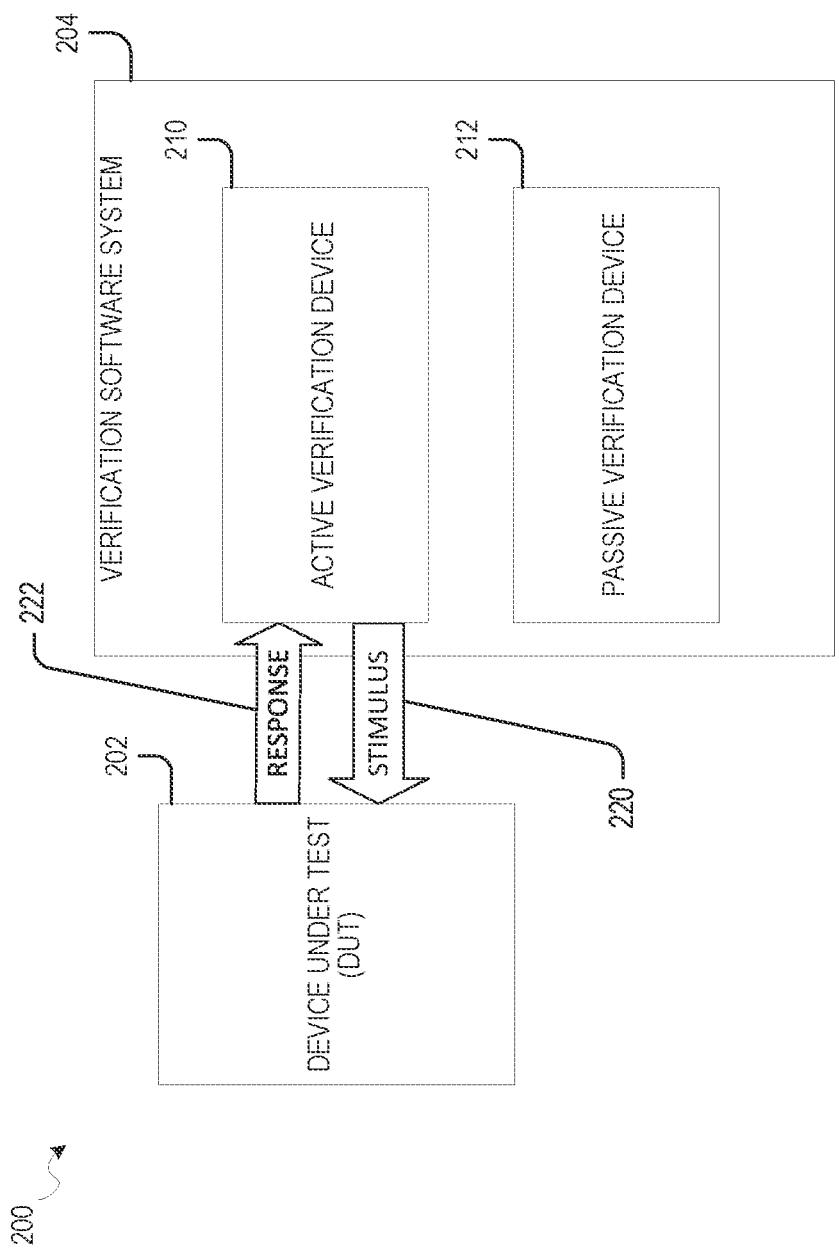
FIG. 2 is a block diagram illustrating an example design verification environment in which design verification with LFPS pulse detection using UI adjustment, based on an average pulse width of detected LFPS pulses, can be implemented in accordance with some embodiments.

FIG. 2 is a block diagram illustrating an example design verification environment in which design verification with LFPS pulse detection using UI adjustment, based on an average pulse width of detected LFPS pulses, can be implemented in accordance with some embodiments. As shown, the design verification environment 200 includes a device under test (DUT) 202 and a verification software system 204, where the DUT 202 can comprise a simulation of a circuit design operating as an active device (e.g., DisplayPort device, such as a DisplayPort source or sink device), and where the verification software system 204 can represent a testbench. According to some embodiments, the verification software system 204 interacts with the DUT 202 (e.g., exchanges stimuli and responses) over a simulated data bus that operatively couples the verification software system 204 with the DUT 202 together, where the simulated data bus can be in compliance with a data communication specification (e.g., a version of the DisplayPort specification). Depending on the embodiment, the DUT 202, the verification software system 204, or both can be operated by (e.g., within) one or more simulators.

The verification software system 204 of FIG. 2 comprises an active verification device 210 (e.g., active verification VIP device) and a passive verification device 212 (e.g., passive verification VIP device). One or both of the active verification device 210 and the passive verification device 212 are implemented by a task, process, or simulated device. According to some embodiments, the active verification device 210 is configured to generate one or more stimuli (220) and to send the one or more stimuli to the DUT 202 (e.g., according to a VIP model, such as a BFM) to facilitate verification implementation of one or more feature (e.g., functions) by the DUT in accordance with a data communication specification (e.g., DisplayPort specification). For some embodiments, the one or more stimuli comprise one or more data packets (e.g., FLITs) transmitted from the active verification device 210 to the DUT 202. The DUT 202 can respond to the one or more stimuli (e.g., FLITs incoming from the active verification device 210) with one or more responses (222). For some embodiments, the one or more responses comprise LFPS pulses transmitted from the DUT 202 to the active verification device 210.

For various embodiments, the passive verification device 212 operates as a verification monitor (e.g., VIP monitor) configured to monitor one or more stimuli and one or more responses exchanged between the active verification device 210 and the DUT 202, maintain (and update) an internal state of the passive verification device 212 based on the one or more stimuli and the one or more responses observed by the passive verification device 212, and verify one or more feature (e.g., functions) of the DUT 202 based on the internal state. According to some embodiments, the verification software system 204 implements design verification with LFPS pulse detection using UI adjustment, based on an average pulse width of detected LFPS pulses.

Figure 3:
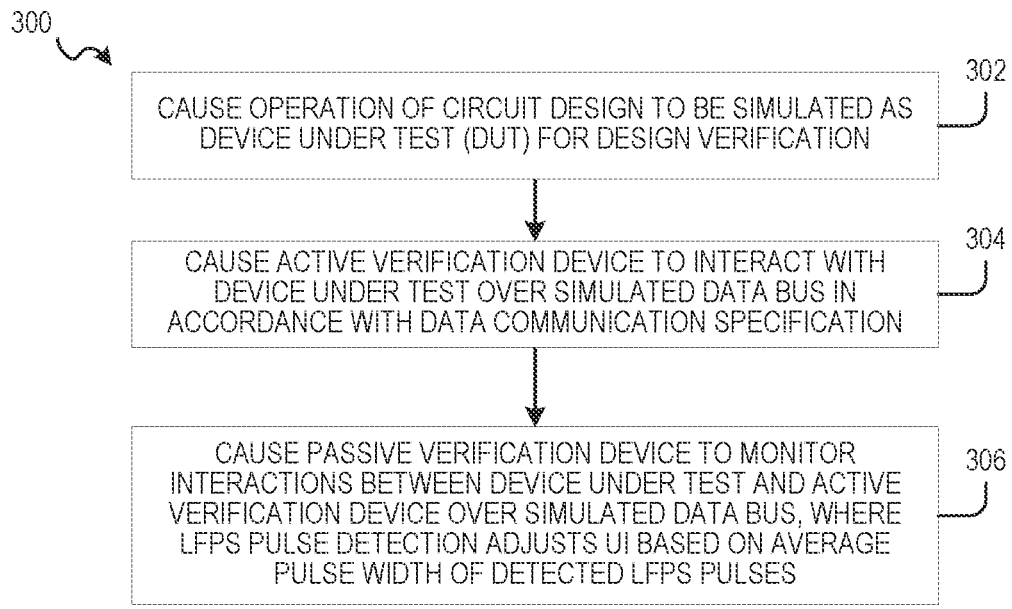
FIGS. 3 through 5 are flowcharts illustrating example methods for design verification with LFPS pulse detection using UI adjustment based on an average pulse width of detected LFPS pulses, according to some embodiments.
Figure 4:
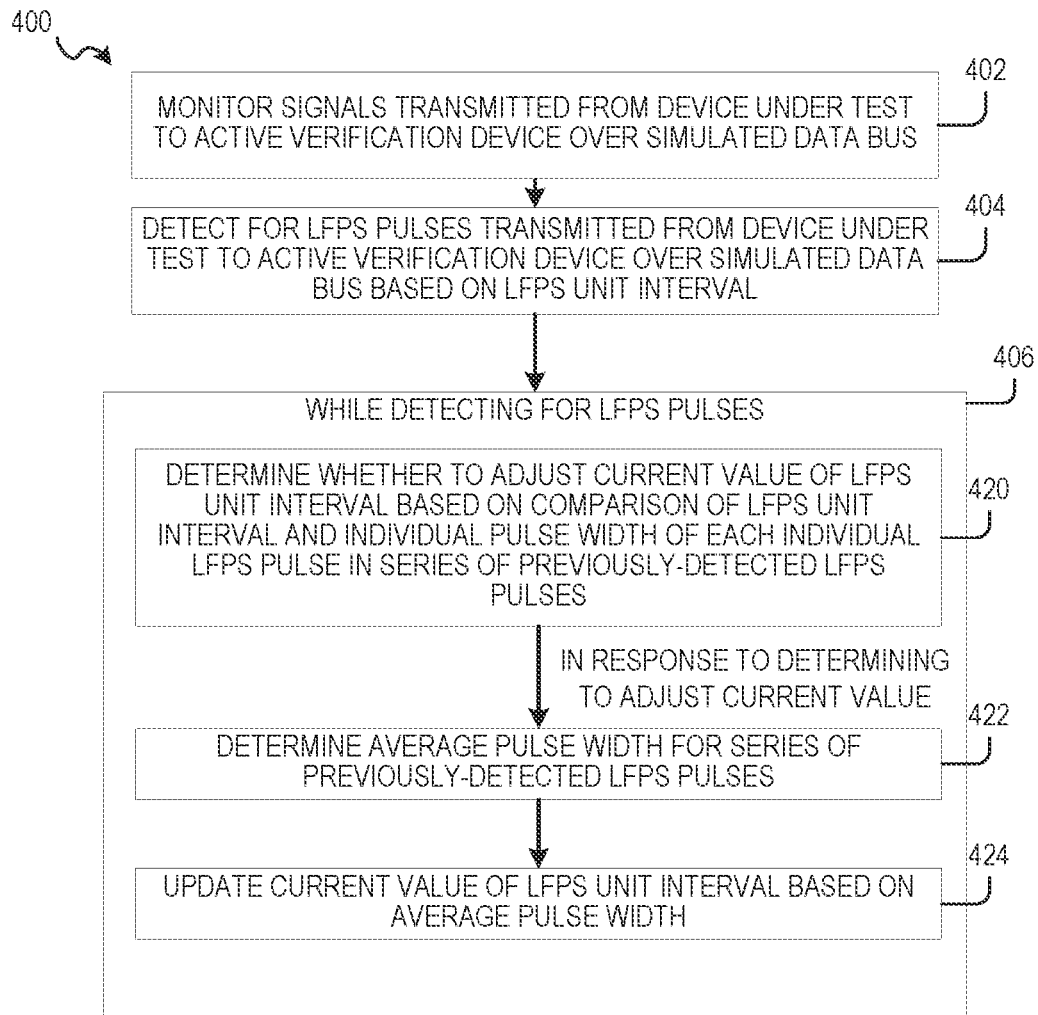
Figure 5:
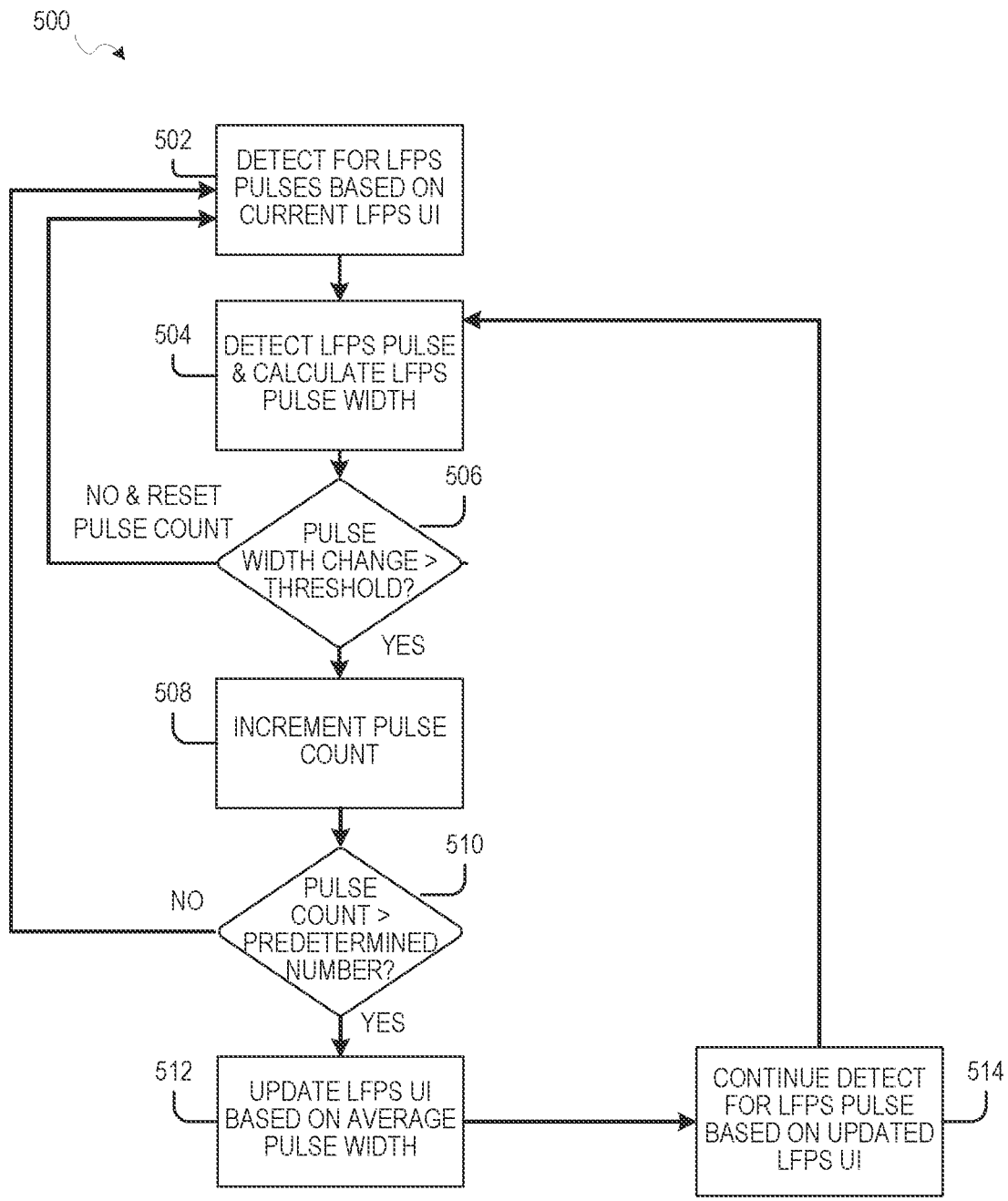

FIGS. 3 through 5 are flowcharts illustrating example methods for design verification with LFPS pulse detection using UI adjustment based on an average pulse width of detected LFPS pulses, according to some embodiments. It will be understood that example methods described herein may be performed by a device, such as a computing device executing instructions of a (design) verification software system, in accordance with some embodiments. Additionally, example methods described herein may be implemented in the form of executable instructions stored on a computer-readable medium or in the form of electronic circuitry. For instance, the operations of any one of methods 300, 400, 500 of FIGS. 3 through 5 may be represented by executable instructions that, when executed by a processor of a computing device, cause the computing device to perform the method. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. An operation of any of methods 300, 400, 500 (or another method described herein) may be performed by a hardware processor (e.g., central processing unit or graphics processing unit) of a computing device (e.g., desktop, server, etc.). Depending on the embodiment, any of methods 300, 400, 500 can be used to perform design verification (e.g., 130) of a circuit design.

Referring now to FIG. 3, at operation 302, a hardware processor causes operation of a circuit design to be simulated by a device under test (DUT) (e.g., 202) for design verification and, at operation 304, the hardware processor causes an active verification device (e.g., 210) to interact with the device under test (e.g., 202) over a simulated data bus in accordance with a data communication specification (e.g., a DisplayPort specification). During operation 306, the hardware processor causes a passive verification device (e.g., 212) to monitor interactions between the device under test (e.g., 202) and the active verification device (e.g., 210) over the simulated data bus, where the passive verification device uses LFPS pulse detection that adjusts UI based on an average pulse width of detected LFPS pulses. According to some embodiments, the passive verification device performs one or more of methods 400, 500 of FIGS. 4 and 5 to implement LFPS pulse detection that adjusts UI based on an average pulse width of detected LFPS pulses.

Referring now to FIG. 4, at operation 402, a hardware processor (e.g., implementing the passive verification device) monitors signals transmitted from the DUT (e.g., 202) to an active verification device (e.g., 210) over a simulated data bus. For various embodiments, signals are transmitted from the DUT (e.g., 202) to the active verification device (e.g., 210) over the simulated data bus in accordance with a data communication specification, such a DisplayPort specification. For some embodiments, the data communication specification defines the use of Low-Frequency Periodic Signaling (LFPS). Additionally, for some embodiments, the DUT is configured to use LFPS to signal (e.g., to the active verification device) entry of a power-save state by the device and to signal exit of the power-save state by the device under test. According to some embodiments, operations 404 and 406 are performed during a LFPS period, which can be defined by the data communication specification.

At operation 404, the hardware processor (e.g., implementing the passive verification device) detects for LFPS pulses transmitted from the DUT (e.g., 202) to the active verification device (e.g., 210) over the simulated data bus based on a LFPS unit interval (UI), where the LFPS UI comprises a current value. For example, the current value of the LFPS UI can be a time value, which can be measured in nanoseconds (ns). According to some embodiments, one or more LFPS pulses can be detected within the LFPS UI. According to some embodiments, at a beginning of a LFPS period, the current value of the LFPS unit interval is set based on (e.g., as defined by) the data communication specification.

During operation 406, while the hardware processor (e.g., implementing the passive verification device) detects for LFPS pulses based on the LFPS unit interval, the hardware processor can perform operations 420 through 424. At operation 420, the hardware processor determines whether to adjust the current value of the LFPS unit interval based on comparison of the current value of the LFPS unit interval and an individual pulse width of each individual LFPS pulse in a series of previously-detected LFPS pulses. According to some embodiments, the series of previously-detected LFPS pulses comprises a predetermined number of LFPS pulses (e.g., 4 LFPS pulses). The predetermined number of LFPS pulses being detected for can be predetermined (e.g., by vendor of the design verification system) or by a user (e.g., set by a design verification user). The predetermined number can be set with a value that represents a sufficient number for determining an average pulse width, a sufficient number that warrants an update (e.g., adjustment) for the LFPS UI, or both. For some embodiments, operation 420 comprises the hardware processor determining whether each LFPS pulse in a series of previously-detected LFPS (e.g., each of the 4 last-detected LFPS pulses) has a pulse width that is larger than the LFPS unit interval by a threshold value (e.g., a tolerance value) and, in response to determining that each LFPS pulse in the series of previously-detected LFPS detected has a pulse width that is larger than the LFPS unit interval by the threshold value, determining to adjust the current value of the LFPS unit interval. The series of previously-detected LFPS pulses can be a series of LFPS pulses last detected (prior to the LFPS UI adjustment check). Some embodiments use a pulse count (e.g., LFPS pulse count) to facilitate the determination of whether to adjust the current value of the LFPS unit interval (based on a comparison of the current value of the LFPS unit interval and the individual pulse width of each individual LFPS pulse in the series of previously-detected LFPS pulses). The threshold value can represent a tolerance value (e.g., set by a user) for how much pulse-to-pulse variation is permitted before the LFPS UI should be adjusted. Depending on the embodiment, the threshold value can be a percentage value (e.g., 5%) or can be a difference value (e.g., time difference value). The threshold value can be set as a predetermined value (e.g., by the vendor creating the design verification system) or can be set as a user-defined value (e.g., by a design verification user).

For some embodiments, operation 420 comprises the hardware processor performing one or more of the following in response to each new LFPS pulse detected by the hardware processor: the hardware processor determines an associated pulse width of the new LFPS pulse; the hardware processor determines whether the associated pulse width is larger than the current value of the LFPS unit interval by a threshold value; and the hardware processor updates a LFPS pulse count based on the determining of whether the associated pulse width is larger than the current value of the LFPS unit interval by the threshold value. As noted, the threshold value can be set to a percentage value or a time difference value. The hardware processor can determine an associated pulse width of a new LFPS pulse by, for example, determining a time difference between a first time of the new LFPS pulse (e.g., a first event detected on a differential voltage pin on main link on the simulated data bus, such as a DisplayPort main link (ML)) and a second time of a previously-detected LFPS (e.g., a subsequent, second event detected on the differential voltage pin), where the associated pulse width is the time difference. For various embodiments, determining whether to adjust the current value of the LFPS unit interval is based on the LFPS pulse count. For example, the hardware processor can determine to adjust the current value of the LFPS unit interval in in response to hardware processor determining that the LFPS pulse count is at least one of equal to or great than a predetermined number of LFPS pulses. In this way, the use of the LFPS pulse count can enable various embodiments to monitor/track how many prior-detected (e.g., last-detected LFPS pulses prior to the UI adjustment check) fall outside a range of pulse-to-pulse variation expected for a LFPS cycle period (e.g., for a LFPS UI), which can determine if and when the hardware processor triggers an adjustment of the LFPS UI. For some embodiments, updating the LFPS pulse count comprises incrementing the LFPS pulse count (e.g., incrementing by one) in response to determining that the associated pulse width is larger than the current value of the LFPS unit interval by the threshold value. Additionally, for some embodiments, updating the LFPS pulse count comprises resetting the LFPS pulse count to an initial value (e.g., such as zero) in response to determining that the associated pulse width is not larger than the current value of the LFPS unit interval by the threshold value.

In response to the hardware processor (e.g., implementing the passive verification device) determining to adjust the current value of the LFPS unit interval, at operation 422, the hardware processor determines an average pulse width for the series of previously-detected LFPS pulses. For some embodiments, operation 422 comprises averaging the individual pulse width of each individual LFPS pulse in the series of previously-detected LFPS pulses. For instance, where the number of LFPS pulses in the series of prior-detected LFPS pulses is 4, the average could be equal to (LFPS_PULSE_WIDTH1+LFPS_PULSE_WIDTH2+LFPS_PULSE_WIDTH3+LFPS_PULSE_WIDTH4)/4. During operation 424, the hardware processor (e.g., implementing the passive verification device) updates the current value of the LFPS unit interval based on the average pulse width (determined by operation 422). For instance, the hardware processor can set the current value of the LFPS unit interval to be equal to the average pulse width.

Depending on the embodiment, the threshold value, the predetermined number, or both can be set in view of a requirement of the data communication specification (upon which the circuit design is being verified). Additionally, operation 406, and operations 420 through 424 therein, can be implemented in accordance with method 500 of FIG. 5.

Referring now to FIG. 5, method 500 represents an example implementation of operation 406 and operations 420 through 424 of method 400. method 500. At operation 502, a hardware processor (e.g., implementing the passive verification device) detects for a LFPS pulses based on a current LFPS UI. At operation 504, the hardware processor detects a new LFPS pulse and calculates a LFPS pulse width for the new LFPS pulse. For example, with respect to a DisplayPort specification, a new LFPS pulse can be detected in response to detecting an event on a voltage pin of a main link (ML) between a DUT (e.g., 202), such as a change (e.g., from logic 0 to 1 or 1 to 0) on a differential pin of the ML. To calculate the LFPS pulse width by determining a time difference between the last event (corresponding to the last LFPS pulse detected) and the current event corresponding to the new LFPS pulse (e.g., current event time—last event time).

At operation 506, the hardware processor (e.g., implementing the passive verification device) determines whether the pulse width of the new LFPS pulse is greater than a threshold value. The threshold value can represent a tolerance value (e.g., set by a user) for how much pulse-to-pulse variation is permitted before the LFPS UI should be adjusted. As noted, the threshold value can comprise a percentage value or a time difference value. For example, the threshold value can be set to 5% or some other percentage value suitable for design verification purposes. If the hardware processor determines that the pulse width of the new LFPS pulse is greater than a threshold value, method 500 proceeds to operation 508, otherwise method 500 returns to operation 502 and resets a pulse count (e.g., to a value of 0), which is used to track how many last-detected LFPS pulses in a series have had a pulse width that surpasses the threshold value. The pulse count enables the hardware processor to detect a predetermined number of last-detected LFPS pulses that were detected in a series and that have pulse widths larger than the threshold value. By returning to operation 502, the hardware processor can continue detection of new LFPS pulses and can restart its detection for the series of last-detected LFPS pulses.

At operation 508, the hardware processor (e.g., implementing the passive verification device) increments the pulse count (e.g., by one) and, at operation 510, the hardware processor determines whether the pulse count is greater than a predetermined number of LFPS pulses, which can be a user-defined value. As described herein, for some embodiment, adjustment of the LFPS UI is triggered when a predetermined number of last-detected LFPS pulses, having pulse widths larger than the threshold value, has been received in a series. If the hardware processor determines the pulse count is greater than a predetermined number of LFPS pulses, method 500 proceeds to operation 512, otherwise method 500 returns to operation 502 to detect for a next, new LFPS pulse.

During operation 512, the hardware processor (e.g., implementing the passive verification device) determines an average pulse width of LFPS pulses in the series of last-detected LFPS pulses and updates (e.g., adjusts) the LFPS UI based on the determined average pulse width. Method 500 then continues to operation 514, where detection of new LFPS pulses continues but using the LFPS UI as updated by operation 512. After operation 514, method 500 returns to operation 504 in response to a new LFPS pulse being detected.

Figure 6:
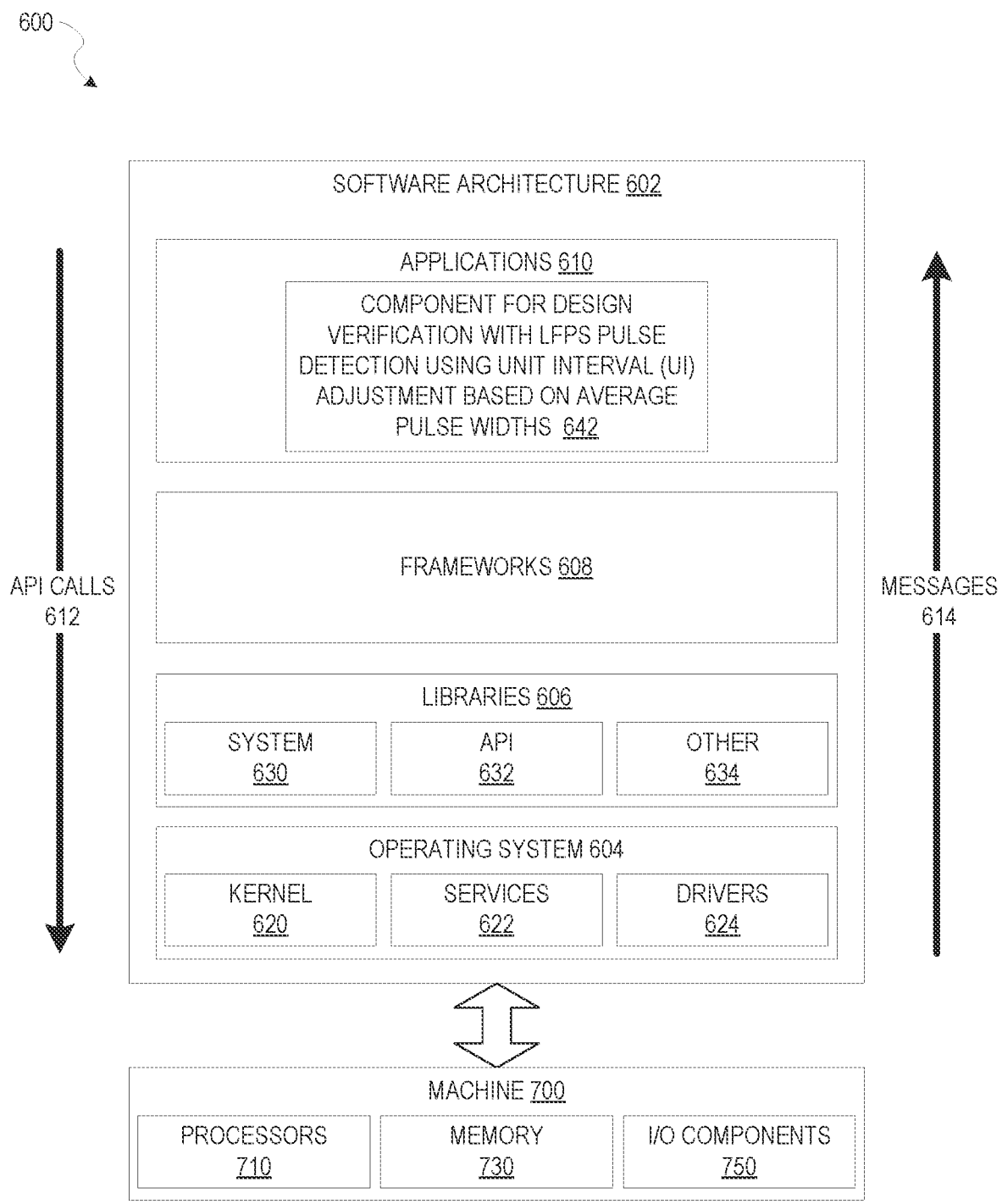
FIG. 6 is a block diagram illustrating an example of a software architecture that may be operating on a design verification computer and may be used with methods for design verification with LFPS pulse detection using UI adjustment based on an average pulse width of detected LFPS pulses, according to some embodiments.

FIG. 6 is a block diagram 600 illustrating an example of a software architecture 602 that may be operating on a design verification computer and may be used with methods for design verification with LFPS pulse detection using UI adjustment based on an average pulse width of detected LFPS pulses, according to some embodiments. The software architecture 602 can be used as a design verification computing device to implement any of the methods described above. Aspects of the software architecture 602 may, in various embodiments, be used to store circuit designs, and to facilitate generation of a circuit design in a design verification environment by verifying a circuit design with LFPS pulse detection using UI adjustment based on an average pulse width of detected LFPS pulses.

FIG. 6 is merely a non-limiting example of a software architecture 602, and it will be appreciated that many other architectures can be implemented to facilitate the functionality described herein. In various embodiments, the software architecture 602 is implemented by hardware such as a machine 700 of FIG. 7 that includes processors 710 (e.g., hardware processors), memory 730, and input/output (I/O) components 750. In this example, the software architecture 602 can be conceptualized as a stack of layers where each layer may provide a particular functionality. For example, the software architecture 602 includes layers such as an operating system 604, libraries 606, software frameworks 608, and applications 610. Operationally, the applications 610 invoke application programming interface (API) calls 612 through the software stack and receive messages 614 in response to the API calls 612, consistent with some embodiments. In various embodiments, any client device, any server computer of a server system, or any other device described herein may operate using elements of the software architecture 602. A design verification computing device described herein may additionally be implemented using aspects of the software architecture 602, with the software architecture 602 adapted for design verification with LFPS pulse detection using UI adjustment based on an average pulse width of detected LFPS pulses in any manner described herein.

In some embodiments, a design verification application of the applications 610 verifies a circuit design with LFPS pulse detection according to embodiments described herein using various components within the software architecture 602. For example, in some embodiments, a design verification computing device similar to the machine 700 includes the memory 730 and the one or more processors 710. The processors 710 also implement design verification component for design verification with LFPS pulse detection using unit interview (UI) adjustment based on an average pulse widths 642 (component 642), in accordance with various embodiments described herein.

In various other embodiments, rather than being implemented as components of the one or more applications 610, the component 642 may be implemented using elements of the libraries 606, the operating system 604, or the software frameworks 608.

In various implementations, the operating system 604 manages hardware resources and provides common services. The operating system 604 includes, for example, a kernel 620, services 622, and drivers 624. The kernel 620 acts as an abstraction layer between the hardware and the other software layers, consistent with some embodiments. For example, the kernel 620 provides memory management, processor management (e.g., scheduling), component management, networking, and security settings, among other functionalities. The services 622 can provide other common services for the other software layers. The drivers 624 are responsible for controlling or interfacing with the underlying hardware, according to some embodiments. For instance, the drivers 624 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 606 provide a low-level common infrastructure utilized by the applications 610. The libraries 606 can include system libraries 630 such as libraries of blocks for use in a design verification environment or other libraries that can provide functions such as memory allocation functions, string manipulation functions, mathematic functions, and the like. In addition, the libraries 606 can include API libraries 632 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 606 may also include other libraries 634.

The software frameworks 608 provide a high-level common infrastructure that can be utilized by the applications 610, according to some embodiments. For example, the software frameworks 608 provide various graphic user interface (GUI) functions, high-level resource management, high-level location services, and so forth. The software frameworks 608 can provide a broad spectrum of other APIs that can be utilized by the applications 610, some of which may be specific to a particular operating system 604 or platform. In various embodiments, the systems, methods, devices, and instructions described herein may use various files, macros, libraries, and other elements of a design verification environment to implement design verification with LFPS pulse detection as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 602, it will be apparent that other files and structures may provide a similar function, in various embodiments.

Certain embodiments are described herein as including logic or a number of components, modules, elements, or mechanisms. Such components can constitute either software components (e.g., code embodied on a machine-readable medium or in a transmission signal) or hardware components. A "hardware component" is a tangible unit capable of performing certain operations and can be configured or arranged in a certain physical manner. In various embodiments, one or more computer systems (e.g., a standalone computer system, a client computer system, or a server computer system) or one or more hardware components of a computer system (e.g., a processor or a group of processors) are configured by software (e.g., an application or application portion) as a hardware component that operates to perform certain operations as described herein.

In some embodiments, a hardware component is implemented mechanically, electronically, or any suitable combination thereof. For example, a hardware component can include dedicated circuitry or logic that is permanently configured to perform certain operations. For example, a hardware component can be a special-purpose processor, such as a field-programmable gate array (FPGA) or an application-specific integrated circuit (ASIC). A hardware component may also include programmable logic or circuitry that is temporarily configured by software to perform certain operations. For example, a hardware component can include software encompassed within a general-purpose processor or other programmable processor. It will be appreciated that the decision to implement a hardware component mechanically, in dedicated and permanently configured circuitry, or in temporarily configured circuitry (e.g., configured by software) can be driven by cost and time considerations.

Accordingly, the phrase "component" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose hardware processor configured by software to become a special-purpose processor, the general-purpose processor may be configured as respectively different special-purpose processors (e.g., comprising different hardware components) at different times. Software can accordingly configure a particular processor or processors, for example, to constitute a particular hardware component at one instance of time and to constitute a different hardware component at a different instance of time.

Hardware components can provide information to, and receive information from, other hardware components. Accordingly, the described hardware components can be regarded as being communicatively coupled. Where multiple hardware components exist contemporaneously, communications can be achieved through signal transmission (e.g., over appropriate circuits and buses) between or among two or more of the hardware components. In embodiments in which multiple hardware components are configured or instantiated at different times, communications between or among such hardware components may be achieved, for example, through the storage and retrieval of information in memory structures to which the multiple hardware components have access. For example, one hardware component performs an operation and stores the output of that operation in a memory device to which it is communicatively coupled. A further hardware component can then, at a later time, access the memory device to retrieve and process the stored output. Hardware components can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented components that operate to perform one or more operations or functions described herein. As used herein, "processor-implemented component" refers to a hardware component implemented using one or more processors.

Similarly, the methods described herein can be at least partially processor-implemented, with a particular processor or processors being an example of hardware. For example, at least some of the operations of a method can be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines 700 including processors 710), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 700, but deployed across a number of machines 700. In some embodiments, the processors 710 or processor-implemented components are located in a single geographic location (e.g., within a home environment, an office environment, or a server farm). In some other embodiments, the processors or processor-implemented components are distributed across a number of geographic locations.

Figure 7:
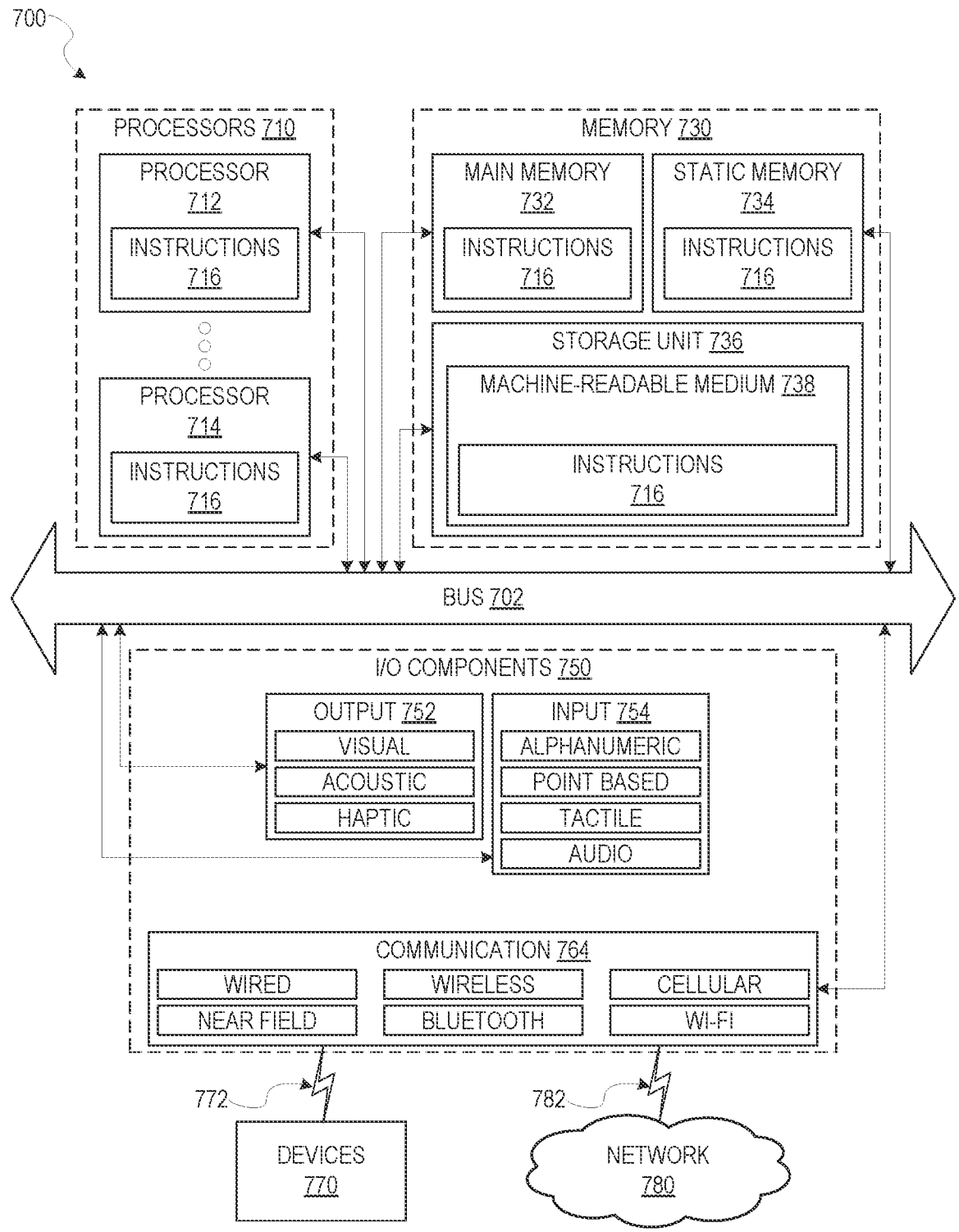
FIG. 7 is a diagrammatic representation of the machine in the form of a computer system within which a set of instructions may be executed to cause the machine to perform any one or more of the methodologies discussed herein, according to some embodiments.

FIG. 7 is a diagrammatic representation of the machine 700 in the form of a computer system within which a set of instructions may be executed to cause the machine 700 to perform any one or more of the methodologies discussed herein, according to some embodiments. FIG. 7 shows components of the machine 700, which is, according to some embodiments, able to read instructions from a machine-readable medium (e.g., a machine-readable storage medium) and perform any one or more of the methodologies discussed herein. Specifically, FIG. 7 shows a diagrammatic representation of the machine 700 in the example form of a computer system, within which instructions 716 (e.g., software, a program, an application, an applet, an app, or other executable code) cause the machine 700 to perform any one or more of the methodologies discussed herein can be executed. In alternative embodiments, the machine 700 operates as a standalone device or can be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 can comprise, but not be limited to, a server computer, a client computer, a personal computer (PC), a tablet computer, a laptop computer, a netbook, or any machine capable of executing the instructions 716, sequentially or otherwise, that specify actions to be taken by the machine 700. Further, while only a single machine 700 is illustrated, the term "machine" shall also be taken to include a collection of machines 700 that individually or jointly execute the instructions 716 to perform any one or more of the methodologies discussed herein.

In various embodiments, the machine 700 comprises processors 710, memory 730, and I/O components 750, which can be configured to communicate with each other via a bus 702. In some embodiments, the processors 710 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 712 and a processor 714 that may execute the instructions 716. The term "processor" is intended to include multi-core processors 710 that may comprise two or more independent processors 712, 714 (also referred to as "cores") that can execute the instructions 716 contemporaneously. Although FIG. 7 shows multiple processors 710, the machine 700 may include a single processor 712 with a single core, a single processor 712 with multiple cores (e.g., a multi-core processor 712), multiple processors 710 with a single core, multiple processors 710 with multiple cores, or any combination thereof.

The memory 730 comprises a main memory 732, a static memory 734, and a storage unit 736 accessible to the processors 710 via the bus 702, according to some embodiments. The storage unit 736 can include a machine-readable medium 738 on which are stored the instructions 716 embodying any one or more of the methodologies or functions described herein. The instructions 716 can also reside, completely or at least partially, within the main memory 732, within the static memory 734, within at least one of the processors 710 (e.g., within the processor's cache memory), or any suitable combination thereof, during execution thereof by the machine 700. Accordingly, in various embodiments, the main memory 732, the static memory 734, and the processors 710 are considered machine-readable media 738.

As used herein, the term "memory" refers to a machine-readable medium 738 able to store data temporarily or permanently and may be taken to include, but not be limited to, random-access memory (RAM), read-only memory (ROM), buffer memory, flash memory, and cache memory. While the machine-readable medium 738 is shown, in some embodiments, to be a single medium, the term "machine-readable medium" should be taken to include a single medium or multiple media (e.g., a centralized or distributed database, or associated caches and servers) able to store the instructions 716. The term "machine-readable medium" shall also be taken to include any medium, or combination of multiple media, that is capable of storing instructions (e.g., the instructions 716) for execution by a machine (e.g., the machine 700), such that the instructions, when executed by one or more processors of the machine (e.g., the processors 710), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 750 include a wide variety of components to receive input, provide output, produce output, transmit information, exchange information, capture measurements, and so on. In general, it will be appreciated that the I/O components 750 can include many other components that are not shown in FIG. 7. The I/O components 750 are grouped according to functionality merely for simplifying the following discussion, and the grouping is in no way limiting. In various embodiments, the I/O components 750 include output components 752 and input components 754. The output components 752 include visual components (e.g., a display (or hardware display) such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 754 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

Communication can be implemented using a wide variety of technologies. The I/O components 750 may include communication components 764 operable to couple the machine 700 to a network 780 or devices 770 via a coupling 782 and a coupling 772, respectively. For example, the communication components 764 include a network interface component or another suitable device to interface with the network 780. In further examples, the communication components 764 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 770 may be another machine or any of a wide variety of peripheral devices (e.g., a peripheral device coupled via a USB).

In various embodiments, one or more portions of the network 780 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 780 or a portion of the network 780 may include a wireless or cellular network, and the coupling 782 may be a Code Division Multiple Access (CDMA) connection, a Global System for Mobile communications (GSM) connection, or another type of cellular or wireless coupling.

Furthermore, the machine-readable medium 738 is non-transitory (in other words, not having any transitory signals) in that it does not embody a propagating signal. However, labeling the machine-readable medium 738 "non-transitory" should not be construed to mean that the machine-readable medium 738 is incapable of movement; the machine-readable medium 738 should be considered as being transportable from one physical location to another. Additionally, since the machine-readable medium 738 is tangible, the machine-readable medium 738 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A system comprising:
   a memory storing instructions; and
   a hardware processor communicatively coupled to the memory and configured by the instructions to perform operations comprising, while operation of a circuit design is simulated as a device under test for design verification:
   monitoring signals transmitted from the device under test to an active verification device over a simulated data bus, the device under test being configured to use Low-Frequency Periodic Signaling (LFPS) to signal entry of a power-save state by the device under test and to signal exit of the power-save state by the device under test;
   detecting for LFPS pulses transmitted from the device under test to the active verification device over the simulated data bus based on a LFPS unit interval, the LFPS unit interval comprising a current value; and
   while detecting for LFPS pulses based on the LFPS unit interval:
   determining whether to adjust the current value of the LFPS unit interval based on comparison of the current value of the LFPS unit interval and an individual pulse width of each individual LFPS pulse in a series of previously-detected LFPS pulses; and
   in response to determining to adjust the current value of the LFPS unit interval:
   determining an average pulse width for the series of previously-detected LFPS pulses; and
   updating the current value of the LFPS unit interval based on the average pulse width.

2. The system of claim 1, wherein the determining of whether to adjust the current value of the LFPS unit interval based on comparison of the current value of the LFPS unit interval and the individual pulse width of each individual LFPS pulse in the series of previously-detected LFPS pulses comprises:
   determining whether each LFPS pulse in a series of previously-detected LFPS detected has a pulse width that is larger than the LFPS unit interval by a threshold value; and
   in response to determining that each LFPS pulse in the series of previously-detected LFPS detected has a pulse width that is larger than the LFPS unit interval by the threshold value, determining to adjust the current value of the LFPS unit interval.

3. The system of claim 1, wherein the determining of whether to adjust the current value of the LFPS unit interval based on comparison of the current value of the LFPS unit interval and the individual pulse width of each individual LFPS pulse in the series of previously-detected LFPS pulses comprises:
   in response to detecting each new LFPS pulse:
   determining an associated pulse width of the new LFPS pulse;
   determining whether the associated pulse width is larger than the current value of the LFPS unit interval by a threshold value; and
   updating a LFPS pulse count based on the determining of whether the associated pulse width is larger than the current value of the LFPS unit interval by the threshold value, the determining of whether to adjust the current value of the LFPS unit interval being based on the LFPS pulse count.

4. The system of claim 3, wherein the updating of the LFPS pulse count based on the determining of whether the associated pulse width is larger than the current value of the LFPS unit interval by the threshold value comprises:
   incrementing the LFPS pulse count in response to determining that the associated pulse width is larger than the current value of the LFPS unit interval by the threshold value.

5. The system of claim 3, wherein the updating of the LFPS pulse count based on the determining of whether the associated pulse width is larger than the current value of the LFPS unit interval by the threshold value comprises:
   resetting the LFPS pulse count to an initial value in response to determining that the associated pulse width is not larger than the current value of the LFPS unit interval by the threshold value.

6. The system of claim 3, wherein the determining of whether to adjust the current value of the LFPS unit interval based on comparison of the current value of the LFPS unit interval and the individual pulse width of each individual LFPS pulse in the series of previously-detected LFPS pulses comprises:
   in response to determining that the LFPS pulse count is at least one of equal to or great than a predetermined number of LFPS pulses, determining to adjust the current value of the LFPS unit interval.

7. The system of claim 3, wherein the determining of the associated pulse width of the new LFPS pulse comprises:
   determining a time difference between a first time of the new LFPS pulse and a second time of a previously-detected LFPS, the associated pulse width being the time difference.

8. The system of claim 1, wherein the determining of the average pulse width for the series of previously-detected LFPS pulses comprises:
   determining the average pulse width by averaging the individual pulse width of each individual LFPS pulse in the series of previously-detected LFPS pulses.

9. The system of claim 1, wherein the series of previously-detected LFPS pulses comprises a predetermined number of LFPS pulses.

10. The system of claim 1, wherein a new LFPS pulse is detected in response to detecting, on the simulated data bus, a change event on a differential voltage pin of the device under test.

11. The system of claim 1, wherein the device under test is configured to use LFPS in accordance with a data communication specification.

12. The system of claim 11, wherein the data communication specification is a version of a DisplayPort specification.

13. The system of claim 11, wherein at a beginning of a LFPS period, the current value of the LFPS unit interval is set based on the data communication specification.

14. A non-transitory computer-readable medium comprising instructions that, when executed by a hardware processor of a device, cause the device to perform operations comprising, while operation of a circuit design is simulated as a device under test for design verification:
  detecting for Low-Frequency Periodic Signaling (LFPS) pulses transmitted from the device under test to an active verification device over a simulated data bus based on a LFPS unit interval, the device under test being configured to use LFPS to signal entry of a power-save state by the device under test and to signal exit of the power-save state by the device under test, the LFPS unit interval comprising a current value; and
  while detecting for LFPS pulses based on the LFPS unit interval:
    determining whether to adjust the current value of the LFPS unit interval based on comparison of the current value of the LFPS unit interval and an individual pulse width of each individual LFPS pulse in a series of previously-detected LFPS pulses; and
    in response to determining to adjust the current value of the LFPS unit interval:
      determining an average pulse width for the series of previously-detected LFPS pulses; and
      updating the current value of the LFPS unit interval based on the average pulse width.

15. The non-transitory computer-readable medium of claim 14, wherein the determining of whether to adjust the current value of the LFPS unit interval based on comparison of the current value of the LFPS unit interval and the individual pulse width of each individual LFPS pulse in the series of previously-detected LFPS pulses comprises:
  determining whether each LFPS pulse in a series of previously-detected LFPS detected has a pulse width that is larger than the LFPS unit interval by a threshold value; and
  in response to determining that each LFPS pulse in the series of previously-detected LFPS detected has a pulse width that is larger than the LFPS unit interval by the threshold value, determining to adjust the current value of the LFPS unit interval.

16. The non-transitory computer-readable medium of claim 14, wherein the determining of whether to adjust the current value of the LFPS unit interval based on comparison of the current value of the LFPS unit interval and the individual pulse width of each individual LFPS pulse in the series of previously-detected LFPS pulses comprises:
  in response to detecting each new LFPS pulse:
    determining an associated pulse width of the new LFPS pulse;
    determining whether the associated pulse width is larger than the current value of the LFPS unit interval by a threshold value; and
    updating a LFPS pulse count based on the determining of whether the associated pulse width is larger than the current value of the LFPS unit interval by the threshold value, the determining of whether to adjust the current value of the LFPS unit interval being based on the LFPS pulse count.

17. The non-transitory computer-readable medium of claim 16, wherein the updating of the LFPS pulse count based on the determining of whether the associated pulse width is larger than the current value of the LFPS unit interval by the threshold value comprises:
  incrementing the LFPS pulse count in response to determining that the associated pulse width is larger than the current value of the LFPS unit interval by the threshold value.

18. The non-transitory computer-readable medium of claim 16, wherein the updating of the LFPS pulse count based on the determining of whether the associated pulse width is larger than the current value of the LFPS unit interval by the threshold value comprises:
  resetting the LFPS pulse count to an initializing value in response to determining that the associated pulse width is not larger than the current value of the LFPS unit interval by the threshold value.

19. The non-transitory computer-readable medium of claim 16, wherein the determining of whether to adjust the current value of the LFPS unit interval based on comparison of the current value of the LFPS unit interval and the individual pulse width of each individual LFPS pulse in the series of previously-detected LFPS pulses comprises:
  in response to determining that the LFPS pulse count is at least one of equal to or great than a predetermined number of LFPS pulses, determining to adjust the current value of the LFPS unit interval.

20. A method comprising:
  causing, by a hardware processor, operation of a circuit design to be simulated as a device under test for design verification;
  causing, by the hardware processor, an active verification device to interact with the device under test over a simulated data bus in accordance with a data communication specification; and
  causing, by the hardware processor, a passive verification device to monitor interactions between the device under test and the active verification device over the simulated data bus, the passive verification device being configured to:
    monitor signals transmitted from the device under test to an active verification device over a simulated data bus, the device under test being configured to use Low-Frequency Periodic Signaling (LFPS) to signal entry of a power-save state by the device under test and to signal exit of the power-save state by the device under test; and
    detect for LFPS pulses transmitted from the device under test to the active verification device over the simulated data bus based on a LFPS unit interval, the LFPS unit interval comprising a current value; and
    while detecting for LFPS pulses based on the LFPS unit interval:
      determine whether to adjust the current value of the LFPS unit interval based on comparison of the current value of the LFPS unit interval and an individual pulse width of each individual LFPS pulse in a series of previously-detected LFPS pulses; and in response to determining to adjust the current value of the LFPS unit interval:
  determine an average pulse width for the series of previously-detected LFPS pulses; and
  update the current value of the LFPS unit interval based on the average pulse width.

\* \* \* \* \*